United States Patent
Grenouillet et al.

(10) Patent No.: US 12,363,918 B2
(45) Date of Patent: Jul. 15, 2025

(54) METHOD FOR CO-MANUFACTURING A FERROELECTRIC MEMORY AND AN OxRAM RESISTIVE MEMORY AND DEVICE CO-INTEGRATING A FERROELECTRIC MEMORY AND AN OxRAM RESISTIVE MEMORY

(71) Applicant: COMMISSARIAT A L'ENERGIE ATOMIQUE ET AUX ENERGIES ALTERNATIVES, Paris (FR)

(72) Inventors: Laurent Grenouillet, Grenoble (FR); Jean Coignus, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 457 days.

(21) Appl. No.: 17/979,183

(22) Filed: Nov. 2, 2022

(65) Prior Publication Data
US 2023/0133523 A1 May 4, 2023

(30) Foreign Application Priority Data
Nov. 2, 2021 (FR) ........................................ 2111616

(51) Int. Cl.
*H10B 80/00* (2023.01)
*H10B 99/00* (2023.01)

(52) U.S. Cl.
CPC .................................... *H10B 99/00* (2023.02)

(58) Field of Classification Search
CPC ........ H10B 99/00; H10B 53/30; H10B 53/40; H10B 63/30; H10N 70/011; H10N 70/043; H10N 70/24; H10N 70/821; H10N 70/826; H10N 70/8833
See application file for complete search history.

(56) References Cited

U.S. PATENT DOCUMENTS

| 2019/0019551 | A1* | 1/2019 | Lee ........................ H10N 70/24 |
| 2019/0044064 | A1 | 2/2019 | Hakamata et al. |
| 2020/0388757 | A1* | 12/2020 | Yang .................... H10N 70/826 |
| 2021/0296579 | A1* | 9/2021 | Liu ......................... C23C 28/00 |

FOREIGN PATENT DOCUMENTS

| FR | 3 090 196 A1 | 6/2020 |
| FR | 3 101 219 A1 | 3/2021 |

OTHER PUBLICATIONS

Search Report as issued in French Patent Application No. FR2111616, dated Sep. 9, 2022.

* cited by examiner

*Primary Examiner* — Samuel Park
(74) *Attorney, Agent, or Firm* — Pillsbury Winthrop Shaw Pittman LLP

(57) ABSTRACT

A method for co-manufacturing a FeRAM and an OxRAM includes depositing a layer of first electrode carried out identically for a zone Z1 and a zone Z2; depositing a layer of hafnium dioxide-based active material carried out identically for Z1 and Z2; depositing a first conductive layer carried out identically for Z1 and Z2; making a mask at Z2, leaving Z1 free; removing the layer at Z1, with Z2 being protected by the mask; removing the mask at Z2; and depositing a second conductive layer in contact with the layer at Z2 and in contact with the layer at Z1, the material of the layer being chosen to create oxygen vacancies in the active layer and depositing a third conductive layer carried out identically for Z1 and Z2.

11 Claims, 11 Drawing Sheets

[Fig. 1]
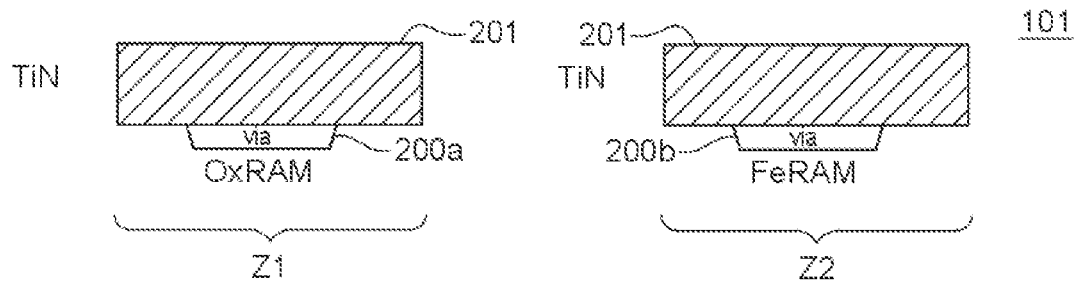
[Fig. 2]
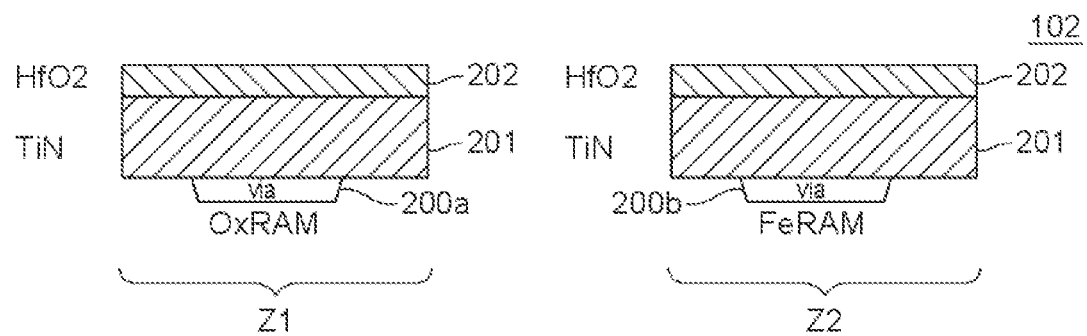
[Fig. 3]
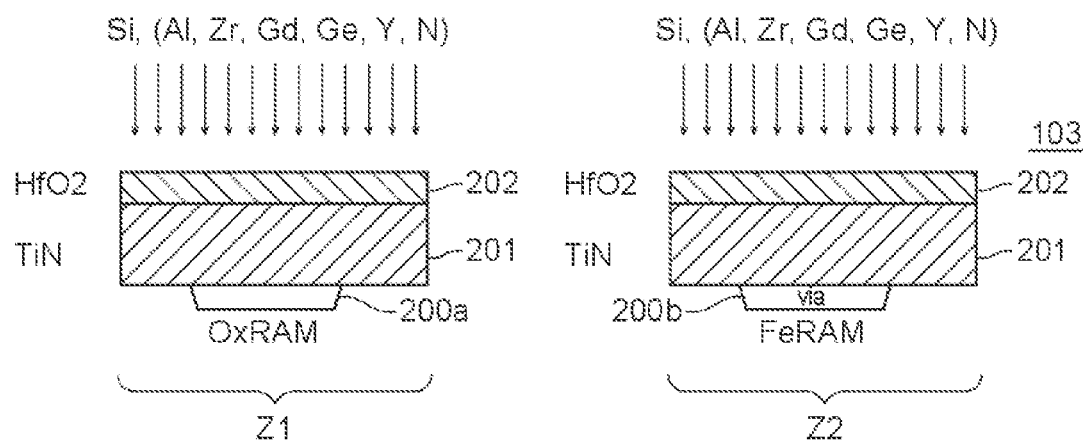
[Fig. 4]
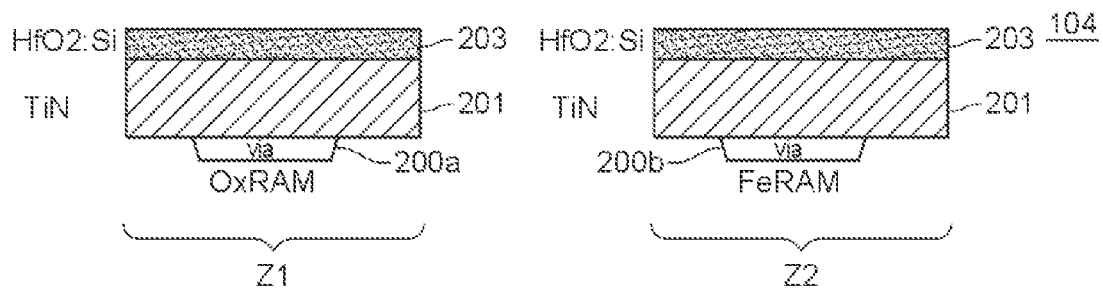

[Fig. 5]
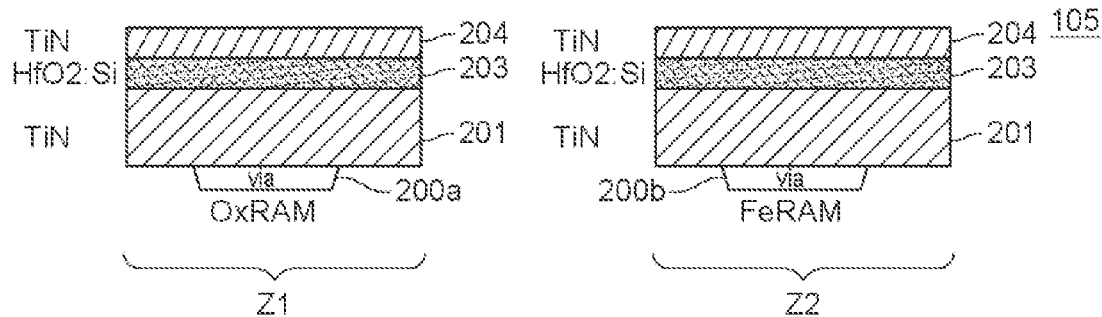
[Fig. 6]
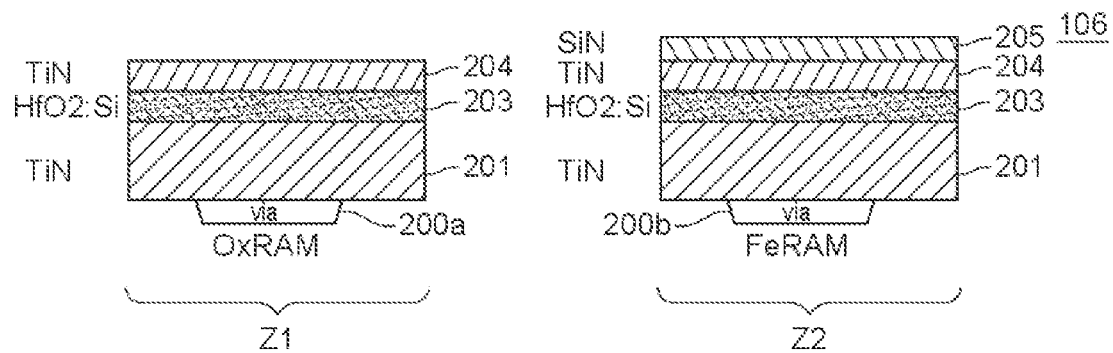
[Fig. 7]
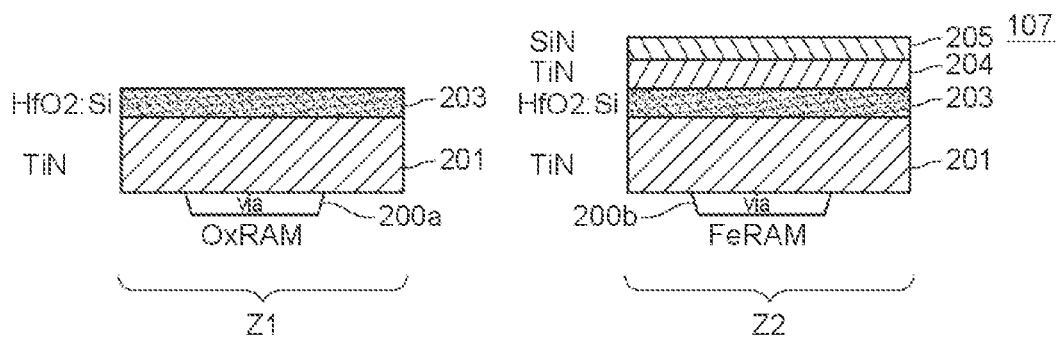
[Fig. 8]
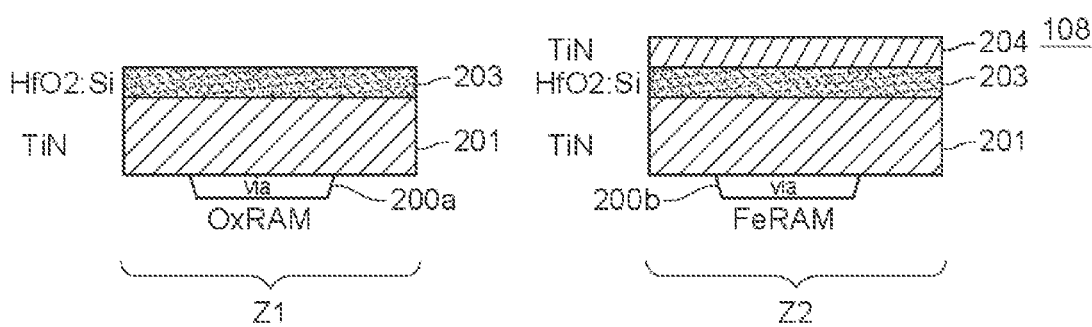

[Fig. 9]
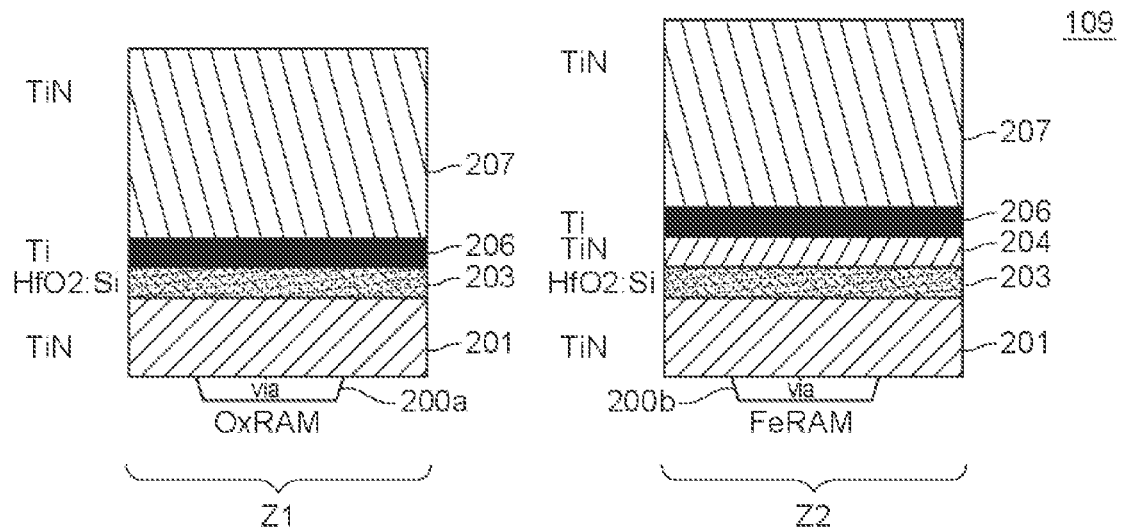
[Fig. 10]
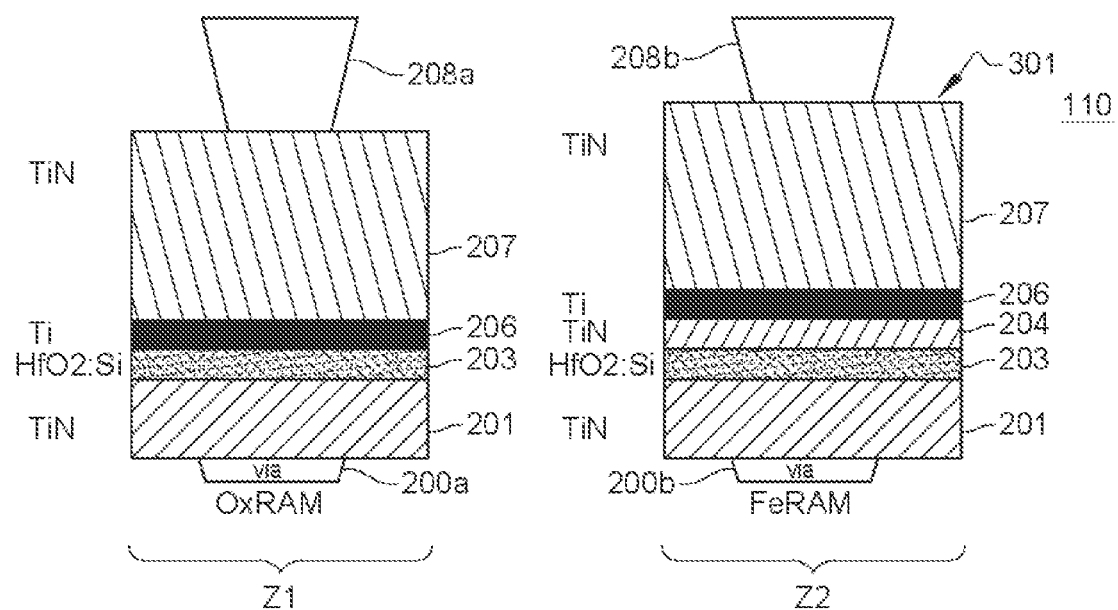

[Fig. 11]
101
102
103  100
104
105
106
107
108
109
110
[Fig. 12]
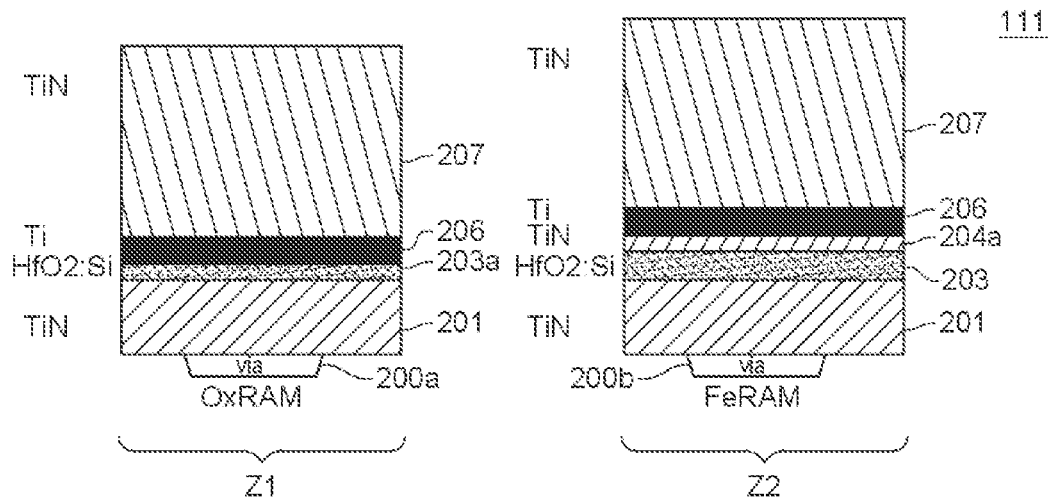

[Fig. 13]
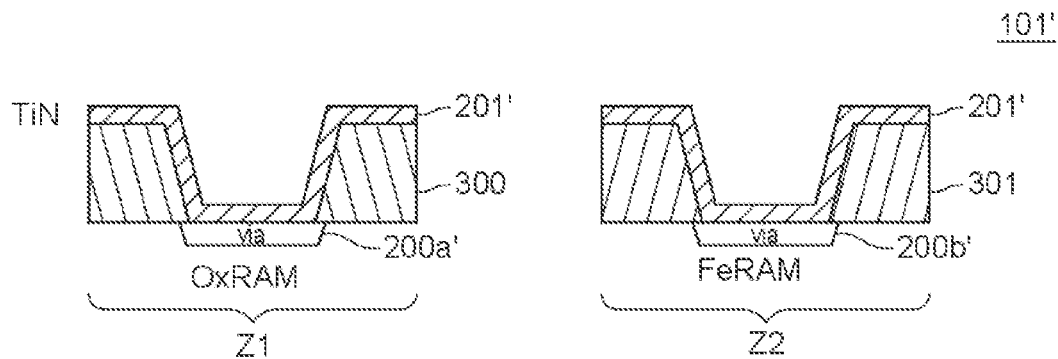
[Fig. 14]
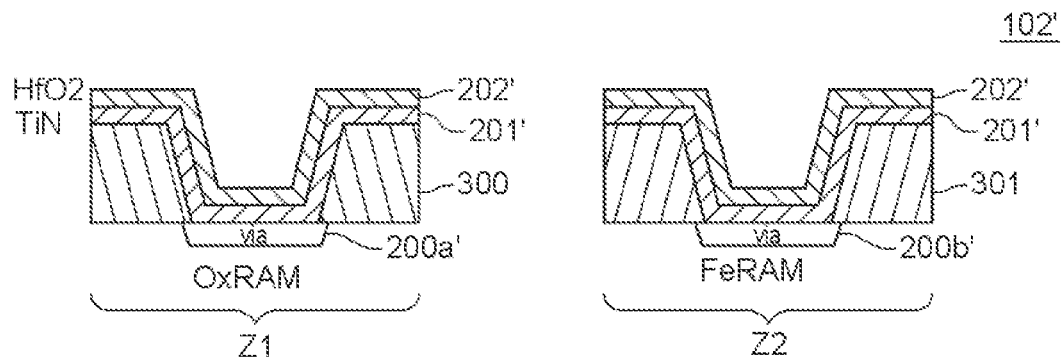
[Fig. 15]
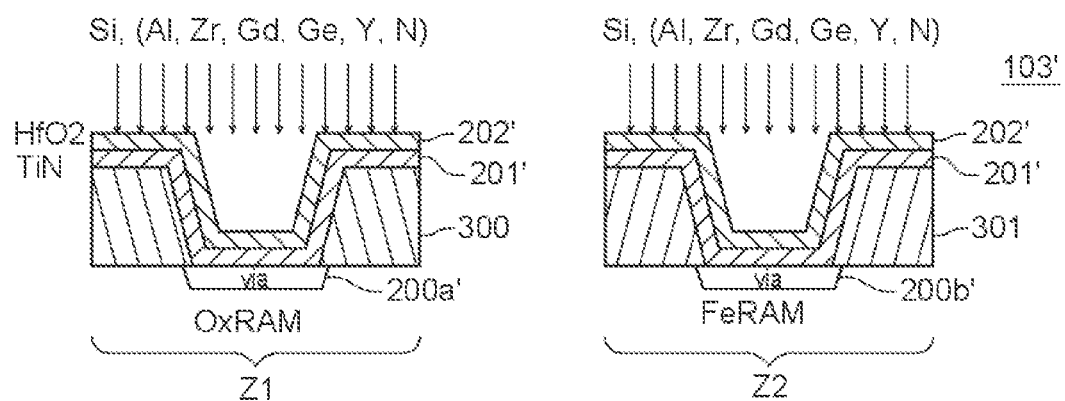

[Fig. 16]
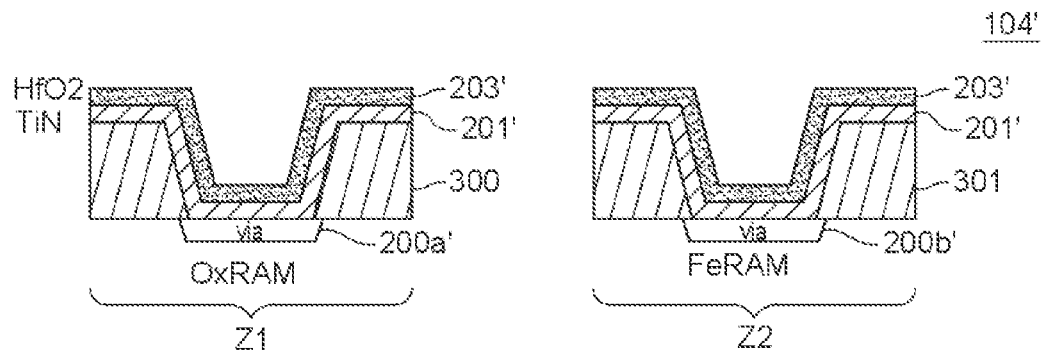
[Fig. 17]
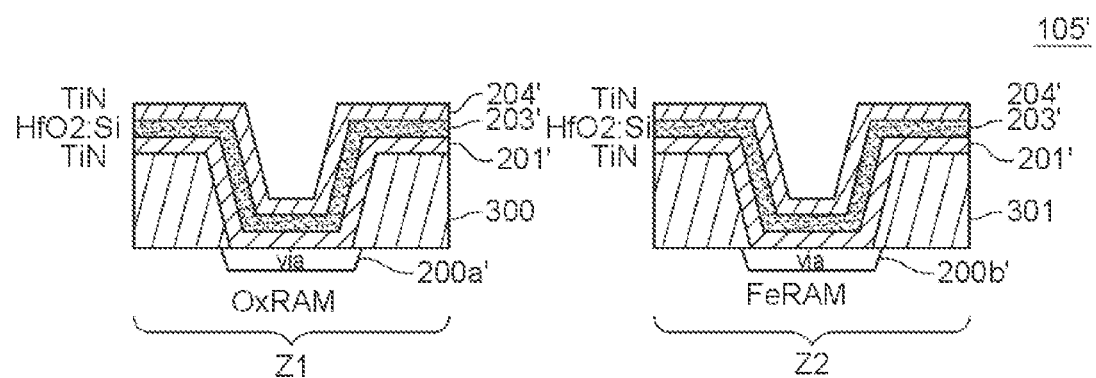
[Fig. 18]
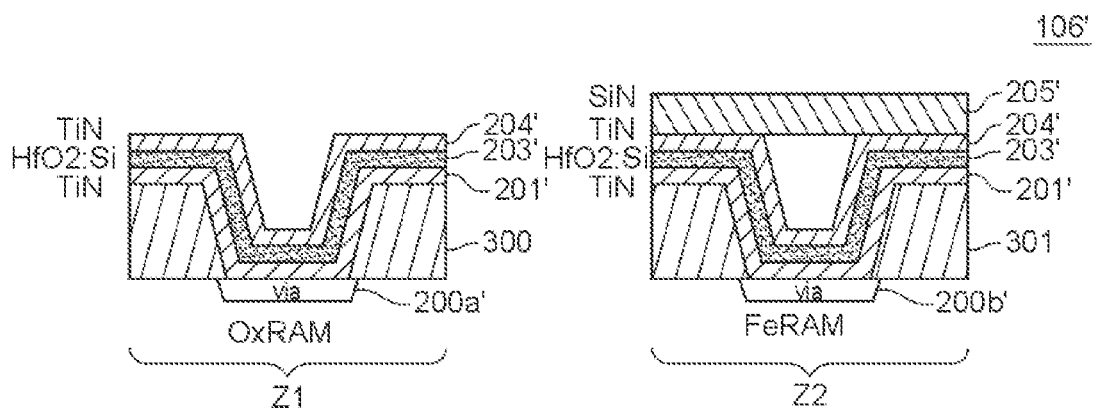

[Fig. 19]
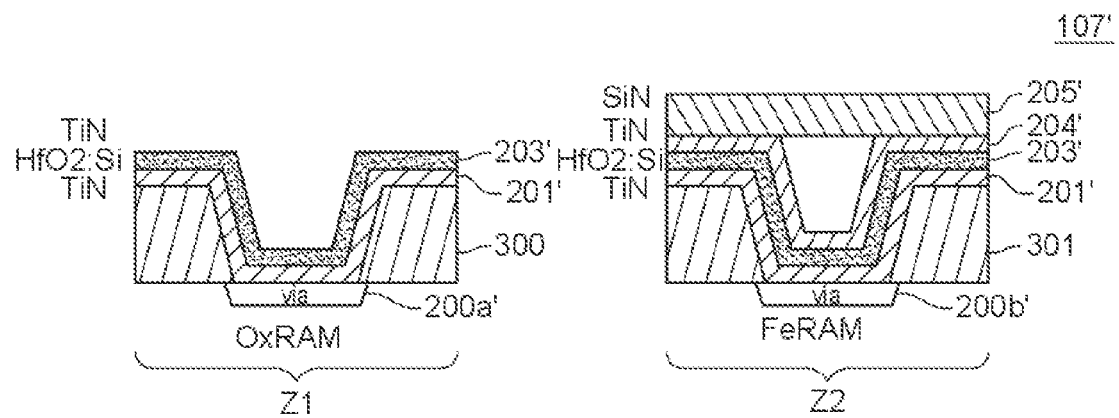
[Fig. 20]
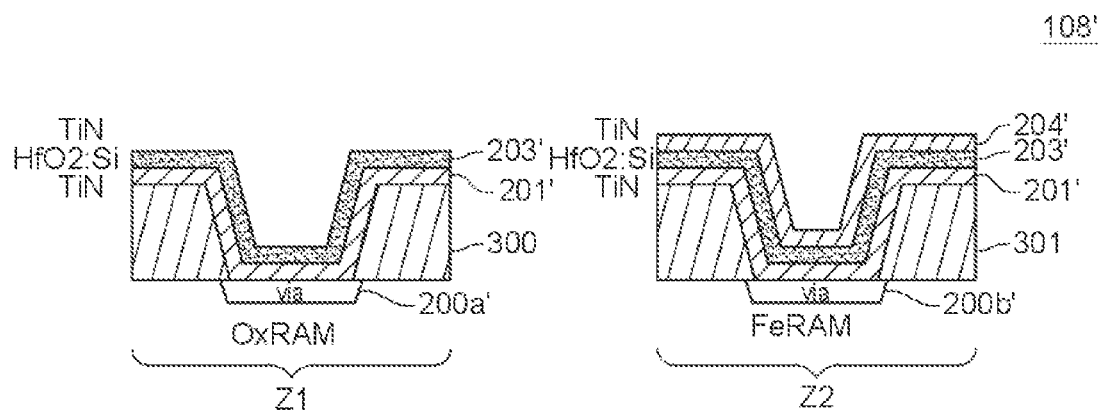
[Fig. 21]
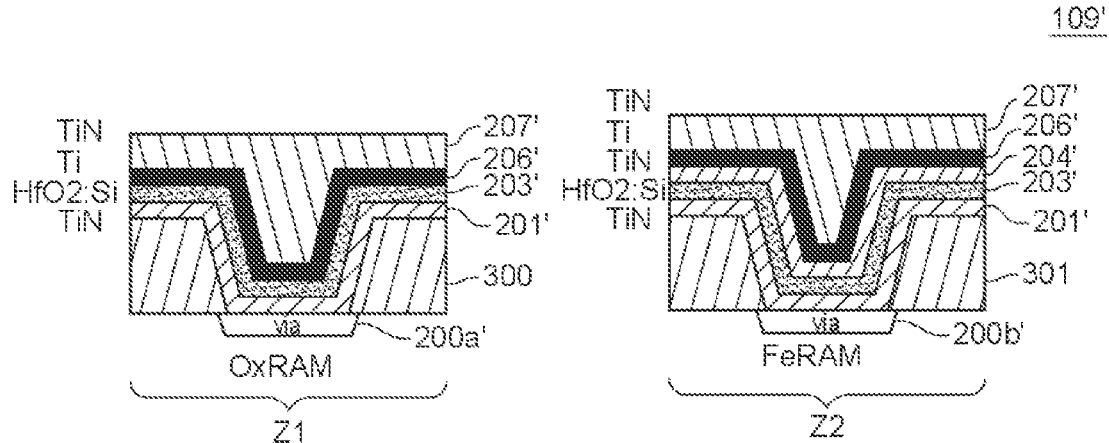

[Fig. 22]
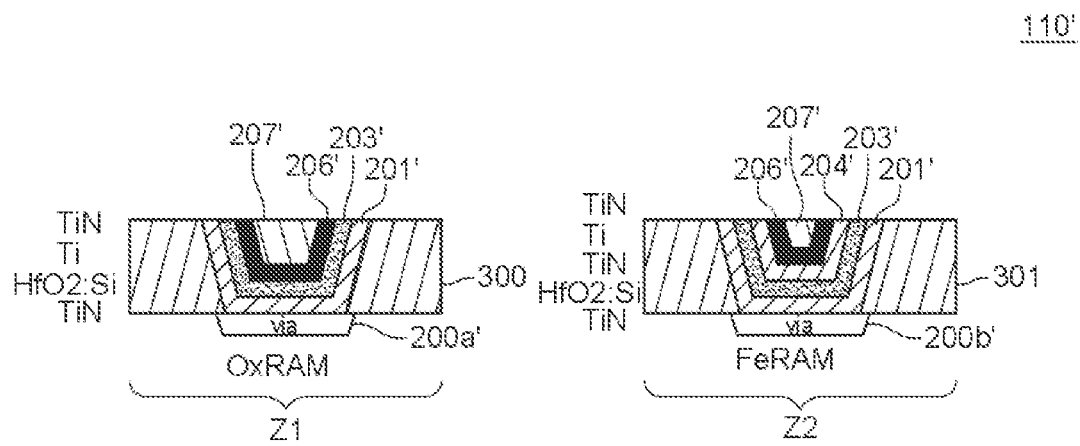
[Fig. 23]
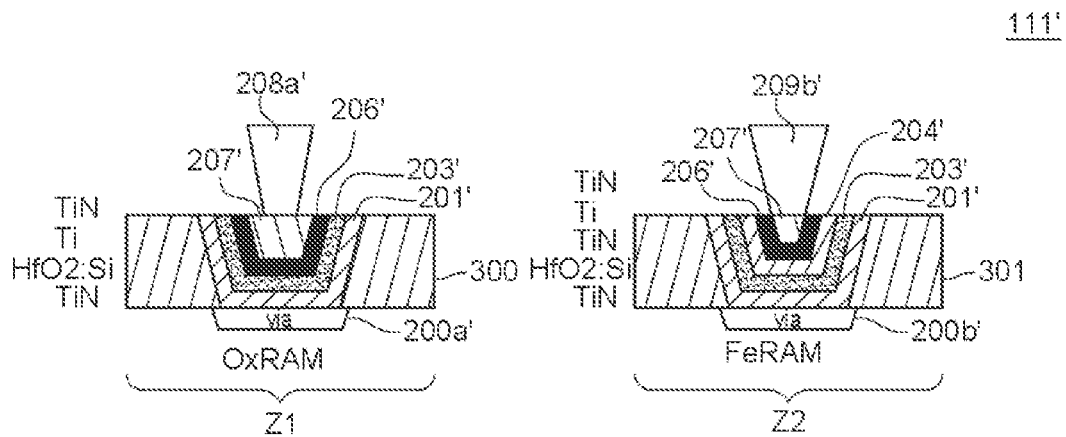

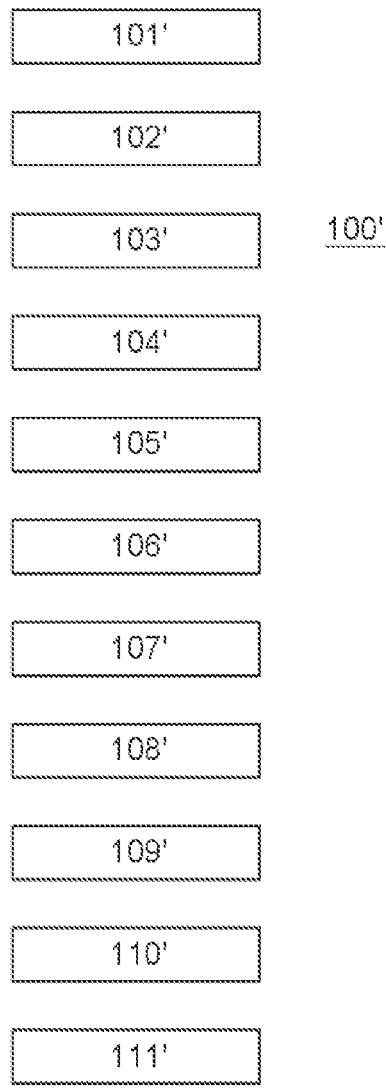
[Fig. 24]

[Fig. 25]
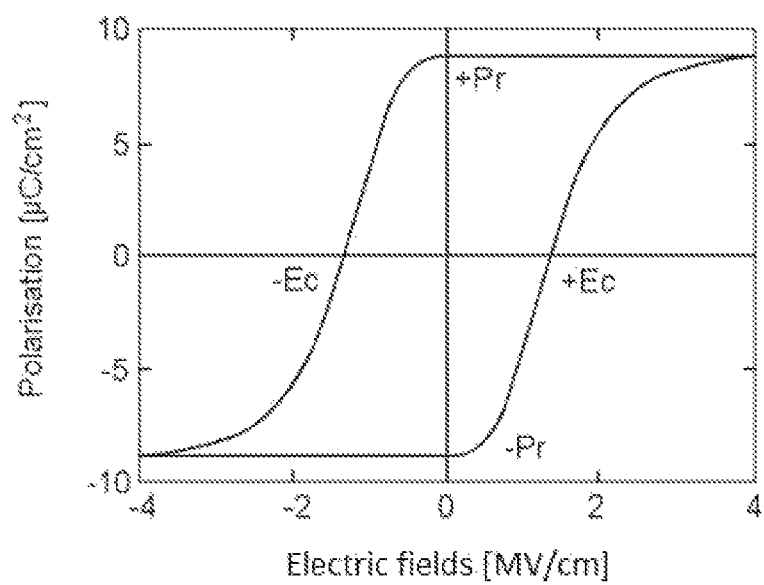

[Fig. 26]
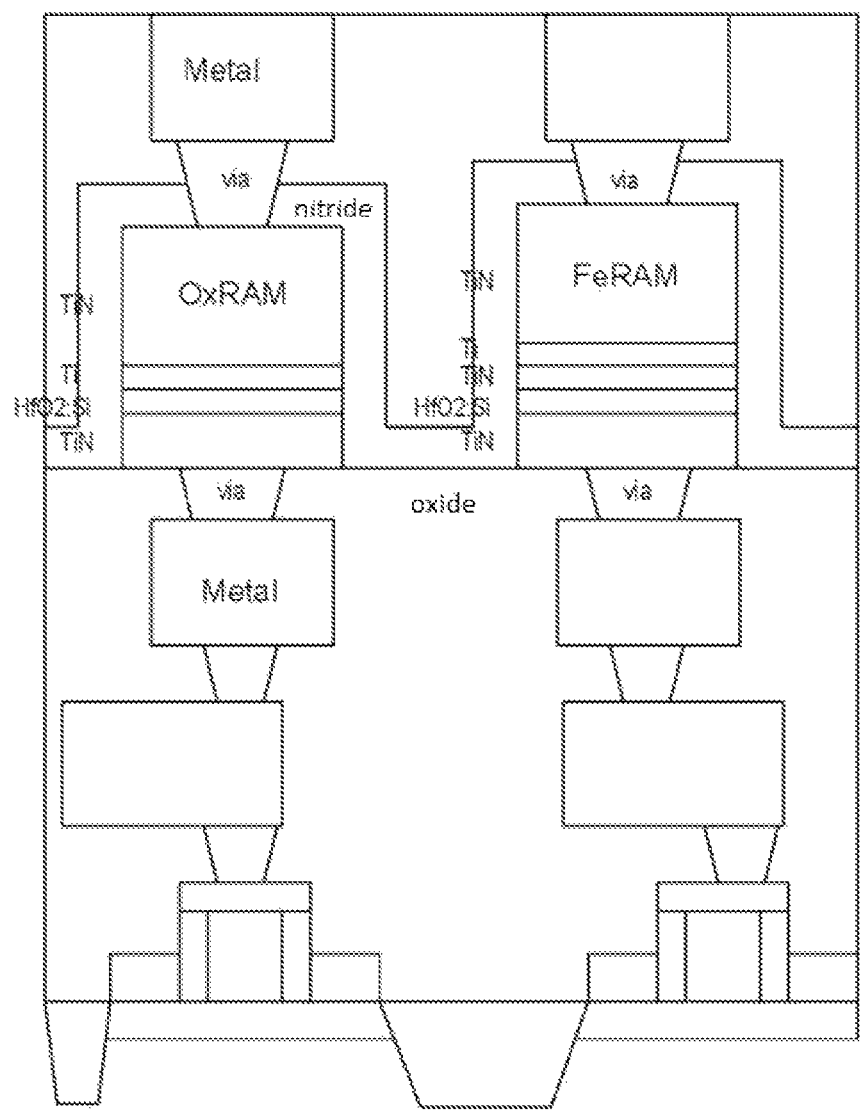

METHOD FOR CO-MANUFACTURING A FERROELECTRIC MEMORY AND AN OxRAM RESISTIVE MEMORY AND DEVICE CO-INTEGRATING A FERROELECTRIC MEMORY AND AN OxRAM RESISTIVE MEMORY

CROSS-REFERENCE TO RELATED APPLICATIONS

This application claims priority to French Patent Application No. 2111616, filed Nov. 2, 2021, the entire content of which is incorporated herein by reference in its entirety.

FIELD

The present invention relates to the manufacture of memories and more particularly to the co-manufacture of a FeRAM ferroelectric memory and an OxRAM resistive memory, each of both memories having a layer of active material based on hafnium dioxide. The present invention also relates to a device co-integrating an OxRAM memory and a FeRAM memory.

BACKGROUND

Developments related to artificial intelligence (AI) have long been confined to the software part. However, AI also has many applications in embedded electronics and it is no longer possible to exclusively rely on the cloud for AI-based calculations. The advent of embedded AI, and the need to process algorithms directly in components, raises, more than ever, the question of hardware. The AI will then need to be processed locally, at the very heart of the components. For this, the use of some microelectronic memories is a particularly promising solution. However, AI-based systems are data-intensive and therefore require a large amount of memory on a single chip to store network states and parameters. Moreover, more than the calculations themselves, it is the data transfers between processors and memories that are very energy-intensive. For this reason, there is a tendency to use small and fast memories with the lowest possible energy dissipation during reading and writing.

All neural networks used in AI require at least two phases:
- A first so-called learning and training phase which consists in optimising a set of parameters or weights of a model from a data set; this first phase requires a large number of writing operations in the memories which should therefore have a high writing endurance.
- A second, so-called inference phase, which consists in suggesting a test data set to the trained model and waiting for a prediction; this case, unlike the previous one, requires a large number of read operations in the memories, which should therefore have very good read endurance.

There are different types of memories that can partially meet the above requirements.

For example, ferroelectric memories or FeRAM memories have the main qualities of being non-volatile, namely retaining stored information even when the voltage is cut off, of consuming little energy, of having low write and read times with respect to other types of non-volatile memories such as FLASH memories, of being able to be massively integrated on chips with low operating voltages and of having low latency in accessibility and good immunity to radiation. In addition, this type of memory has a very high write endurance of more than $10^{10}$ cycles.

Ferroelectric memories are capacitive memories with two remanent polarisation states +Pr and −Pr. [FIG. 25] illustrates the operation of ferroelectric memories. This operation is based on the ferroelectric properties of their active material placed between two electrodes. By applying a potential difference between both electrodes creating an electric field with a value higher than the positive coercive field +Ec, the ferroelectric memory is placed in a high remanent polarisation state +Pr and by applying a potential difference creating an electric field with a value lower than the negative coercive field −Ec, the ferroelectric memory is placed in a low remanent polarisation state −Pr. The high remanent polarisation state +Pr then corresponds to the binary logic state '0' and the low remanent polarisation state −Pr to the binary logic state '1', allowing the information to be stored. Note that when the potential difference is stopped being applied, the remanent polarisation state remains: this explains the non-volatile nature of ferroelectric memories. When reading a ferroelectric memory, it is not known a priori in which polarisation state the memory is. So, for reading, it is assumed that there is a given state and a voltage, for example positive voltage will be applied, beyond the voltage creating an electric field with a value higher than the positive coercive field +Ec: if the memory was already in the state of high remanent polarisation +Pr, this polarisation state will not be changed and no current peak will be observed (or a very small current peak will be observed). Conversely, if the memory was in the low non-volatile bias state −Pr, a much larger current peak will be observed. The consequence of this reading operation is that it is destructive for the polarisation state. It is therefore easy to see that while ferroelectric memories meet the massive writing criterion necessary for the learning and training phase, nevertheless they are not adapted to the inference phase, which requires very good reading endurance.

Another type of so-called resistive memory is known, such as OxRAM memories for "Oxide Resistive RAMs". These memories can have at least two resistive states, corresponding to a High Resistance State ("HRS") and a Low Resistance State ("LRS"), when a voltage is applied.

The main qualities of OxRAM memories are that they are non-volatile, namely they retain stored information even when the voltage is switched off, they have low write and read times with respect to other types of non-volatile memories such as FLASH memories, they can be massively integrated on chips, and they have low latency in accessibility and good immunity to radiation and temperature. They therefore seem to be good candidates for AI applications. However, their write and erase endurance is rather limited (around $10^5$ cycles), making them not very efficient during the learning and training phase.

OxRAM memories have an M-I-M (Metal-Insulator-Metal) structure comprising an active material with variable electrical resistance, generally a transition metal oxide (e.g. $WO_3$, $HfO_2$, $Ta_2O_5$, $TiO_2$, etc.), disposed between two metal electrodes. The transition from the "HRS" state to the "LRS" state is governed by the formation and breakage of a conductive filament between both electrodes. This conductive filament is created by virtue of the presence of oxygen vacancies in the active layer of the memory. By changing potentials applied to the electrodes, it is possible to change distribution of the filament, and thus change electrical conduction between both electrodes. In the active layer, the electrically conductive filament is either broken or, on the contrary, reformed to vary the resistance level of the memory cell, during write and then reset cycles of this cell (SET operations, when the filament is reformed, leading to the LRS state, and RESET operations, leading to the HRS state, when the filament is broken again by applying a SET, VSET, or RESET, VRESET, voltage to the electrode terminals respectively). The manufacture of a filament memory comprises a so-called "forming" step, in which the filament is formed for the first time in the active layer, which is initially filament-free. The active layer is initially completely electrically insulating. During the initial forming step, an electrically conductive filament is formed in the active layer, by performing a kind of controlled breakdown of this layer. The formed filament then extends through the active layer, electrically connecting the bottom and top electrodes. To carry out this forming step, an electrical voltage can be applied between the lower and top electrodes of the memory cell in question, and then the value of this voltage can be progressively increased up to a threshold voltage, known as the forming voltage $V_{forming}$, above which breakdown of the active layer is achieved. After this forming step, the memory cell is ready for use. The conductive filament can then be broken, and then reformed, then broken again and so on, at a voltage value lower than the forming voltage $V_{forming}$.

It is understood upon reading the above that neither ferroelectric memories nor OxRAMs fully meet AI-based system requirements due to either read (for FeRAMs) or write (for OxRAMs) limitations.

Even if patent application FR3090196 does not explicitly concern AI applications, it describes the co-integration of an OxRAM memory and a FeRAM memory on the same chip, thus making it possible to combine benefits in writing and reading of both memories. This co-integration takes advantage of the fact that the same active material, HfO2, is used for the active layer of the OxRAM and the FeRAM.

The manufacturing method described in patent application FR3090196 for achieving this co-integration is, however, complex to implement insofar as it requires a masking level to differentiate doping of the active layer used for FeRAM from that of the active layer used for OxRAM. The method additionally involves the use of sub-microsecond laser annealing for reducing heating time of the doped active material and ensuring adequate crystallisation of the hafnium dioxide into the form providing it with ferroelectric properties without overheating the underlying layers. Further, the electrical efficiency of the OxRAM obtained by this method is not entirely satisfactory.

SUMMARY

An aspect of the invention provides a solution to the problems previously discussed by making it easier to manufacture a ferroelectric memory co-integrated with an OxRAM resistive memory while preserving efficient properties of FeRAM and OxRAM memories.

To this end, an aspect of the invention is especially a method for co-manufacturing a ferroelectric memory including a first electrode, a second electrode and a layer of hafnium dioxide active-based material disposed between the first electrode and the second electrode, and an OxRAM resistive memory including a first electrode, a second electrode and a layer of hafnium dioxide $HfO_2$-based active material disposed between the second electrode and the first electrode, the co-manufacturing method including the following steps:

A step of depositing a layer of first electrode carried out identically for the zone for forming the OxRAM resistive memory and the zone for forming the ferroelectric memory;

A step of depositing a layer of active material based on hafnium dioxide carried out identically for the zone for forming the OxRAM resistive memory and the zone for forming the ferroelectric memory;

A step of depositing a first conductive layer carried out identically for the zone for forming the OxRAM resistive memory and the zone for forming the ferroelectric memory;

A step of forming a mask at the zone of the first conductive layer for forming the ferroelectric memory, leaving the zone of the first conductive layer for forming the OxRAM resistive memory free;

A step of removing the first conductive layer at the zone of the first conductive layer for forming the OxRAM resistive memory, the zone of the first conductive layer for forming the ferroelectric memory being protected by the mask;

A step of removing the mask at the zone of the first conductive layer for forming the ferroelectric memory;

A step of depositing a second conductive layer, said second conductive layer being in contact with the first conductive layer at the zone of the first conductive layer for forming the ferroelectric memory and in contact with the layer of active material at the zone of the first conductive layer for forming the OxRAM resistive memory, the material of the second conductive layer being selected to create oxygen vacancies in the active layer of the OxRAM when the second conductive layer is in contact with the active layer of the OxRAM;

A step of depositing a third conductive layer carried out identically for the zone for forming the OxRAM resistive memory and the zone for forming the ferroelectric memory, said third conductive layer being in contact with the second conductive layer.

By virtue of the invention, unlike in the case of patent application FR3090196, there is no need for additional masking to obtain different doping in the respective active layers of the FeRAM memory and OxRAM memory. Surprisingly, the inventors actually realised that an identical active layer for both memories made it possible to obtain both the ferroelectric effect in FeRAM and the resistive memory effect in OxRAM (as opposed to application FR3090196, where the active layer of the OxRAM memory was much more doped than that of the ferroelectric memory). Thus, the doping of the hafnium dioxide active layer, which is necessary for FeRAM, is also sufficient for the resistive operation of OxRAM. The same reasoning applies to an active layer formed by a hafnium dioxide-based alloy, as for example $HfZrO_2$: in the case of $HfZrO_2$, the ternary alloy $HfZrO_2$ does not necessarily require doping of the active layer, but the latter is identical for OxRAM and FeRAM. In general, a hafnium dioxide-based layer of active material is understood to be either a doped $HfO_2$ layer or a hafnium dioxide-based alloy such as $HfZrO_2$ that is not necessarily doped.

To do this, the method according to an aspect of the invention beneficially uses a modification of the top electrode which will be different for OxRAM and for FeRAM. Indeed, according to an embodiment of the method of the invention, the top electrode will be formed respectively:

By a bilayer formed by the second conductive layer and the third conductive layer for the OxRAM By a tri-layer formed by the first conductive layer, the second conductive layer and the third conductive layer for the FeRAM.

The second conductive layer is in direct contact with the hafnium dioxide-based active layer for the OxRAM and has the feature of being an "Oxygen scavenging layer" type layer, that is a layer to create oxygen vacancies in the hafnium dioxide-based active layer of the OxRAM when this second conductive layer is in contact with the active layer of the OxRAM. For example, this may be a layer of titanium Ti or hafnium Hf. Conversely, the active layer on the FeRAM side is in contact with the first conductive layer, which is not a layer creating oxygen vacancies, for example a TiN layer, on which the second conductive layer is deposited. By doing so, oxygen vacancies are created in the hafnium dioxide-based layer of the OxRAM without creating oxygen vacancies in the hafnium dioxide-based layer of the FeRAM, thereby ensuring efficient resistive operation of the OxRAM, despite the identical doping in the active layers for the OxRAM and FeRAM.

In addition, an aspect of the method according to the invention makes it possible to dispense with localised sub-microsecond laser annealing. Indeed, adequate crystallisation of hafnium dioxide in the orthorhombic form providing it with ferroelectric properties is directly achieved via the thermal budget of the various manufacturing steps, particularly in "back end" integration compatible with CMOS technology. Moreover, the fact of using an $HfO_2$-based active layer crystallised in its orthorhombic phase is not detrimental to the operation of the OxRAM memory, for which the person skilled in the art usually uses amorphous or monoclinic $HfO_2$.

In addition to the features just discussed in the preceding paragraph, the method according to an aspect of the invention may have one or several complementary characteristics among the following, considered individually or according to any technically possible combination:
the step of making the mask at the zone of the first conductive layer for forming the ferroelectric memory while leaving the zone of the first conductive layer for forming the OxRAM resistive memory free includes the following steps:
  A step of depositing a mask on the first conductive layer at the zone of the first conductive layer for forming the ferroelectric memory and the zone of the first conductive layer for forming the OxRAM resistive memory;
  A step of removing the mask at the zone of the first conductive layer for forming the OxRAM resistive memory while leaving the mask at the zone of the first conductive layer for forming the ferroelectric memory.
The method according to an embodiment of the invention includes, at the end of the step of depositing the hafnium dioxide-based layer of active material, a step of doping the layer of active material carried out identically for the zone for forming the OxRAM resistive memory and the zone for forming the ferroelectric memory
the doping step is carried out by ion implantation or using a doping precursor or by co-sputtering.
the dopant element used for the doping step is selected from one of the following elements: Si, Al, Zr, Gd, Ge, Y or N;
the dopant element is Si (the doping step being in an embodiment carried out by ion implantation and with a layer of active material thickness in the order of 10 nm) and the layer of active material is exposed to a dopant dose of between $10^{14}$ ions/cm$^2$ and $5.10^{14}$ ions/cm$^2$;
the method according to an embodiment of the invention includes a heat treatment step to crystallise the layer of active material in an orthorhombic phase.

Another aspect of the present invention is a device including an OxRAM resistive memory arranged in a first dedicated zone and a ferroelectric memory arranged in a second dedicated zone,
the ferroelectric memory including a first electrode, a second electrode and a layer of hafnium dioxide-based active material disposed between the first electrode and the second electrode,
the OxRAM resistive memory including a first electrode, a second electrode and a layer of hafnium dioxide-based active material disposed between the first electrode and the second electrode,
the bottom electrodes of the ferroelectric and resistive OxRAM memories being formed by the same layer of first electrode present on the first and second dedicated zones, the layers of hafnium dioxide $HfO_2$-based active material of the ferroelectric and resistive OxRAM memories being formed by a same layer of hafnium dioxide-based active material present on the first and second dedicated zones,
the second electrode of the ferroelectric memory being formed by a tri-layer including, in the second dedicated zone, a first conductive layer in contact with the active layer, a second conductive layer on the first conductive layer and a third conductive layer on the second conductive layer,
the second electrode of the OxRAM resistive memory being formed by a bilayer including in the first dedicated zone, the second conductive layer in contact with the active layer and the third conductive layer on the first conductive layer,
the material of the second conductive layer being selected to create oxygen vacancies in the active layer of the OxRAM resistive memory when the second conductive layer is in contact with the active layer of the OxRAM.

The device according to an aspect of the invention may especially be obtained by the co-manufacturing method according to the invention.

In addition to the characteristics just discussed in the preceding paragraph, the device according to an aspect of the invention may have one or several complementary characteristics from among the following, considered individually or in any technically possible combination:
the thickness of the active layer and/or the thickness of the second conductive layer is typically between 3 nm and 15 nm.
the thickness of the third conductive layer is typically between 20 nm and 200 nm.
the ferroelectric memory includes a pit having an inner wall on which the layer of first electrode, the hafnium dioxide-based layer of active material, the tri-layer including the first conductive layer, the second conductive layer and the third conductive layer on the second conductive layer are successively arranged.

An aspect of the present invention also relates to a method for training and inferring an artificial intelligence system including a device according to the invention, wherein the ferroelectric memory is used in the training phases and the OxRAM resistive memory is used in the inference phases.

The invention and its various applications will be better understood upon reading the following description and upon examining the accompanying figures.

BRIEF DESCRIPTION OF THE FIGURES

The figures are set forth by way of illustrating and in no way limiting purposes of the invention.

FIGS. 1 to 10 illustrate the different steps of the method for co-manufacturing a ferroelectric memory and an OxRAM memory according to a first embodiment of the invention.

FIG. 11 shows the flowchart of the method steps according to a first embodiment of the invention illustrated in FIGS. 1 to 10.

FIG. 12 illustrates an alternative embodiment of the method of FIG. 11.

FIGS. 13 to 23 illustrate the different steps of the method for co-manufacturing a ferroelectric memory and an OxRAM memory according to a second embodiment of the invention.

FIG. 24 shows the flowchart of the method steps according to a second embodiment of the invention illustrated in FIGS. 13 to 23.

FIG. 25 illustrates the operation of ferroelectric memories.

FIG. 26 illustrates a ferroelectric memory and an OxRAM memory according to the invention which are co-integrated in backend on a CMOS transistor.

DETAILED DESCRIPTION

Unless otherwise specified, a same element appearing in different figures has a unique reference.

An aspect of the invention relates to a method for co-manufacturing a FeRAM ferroelectric memory and an OxRAM memory, each having hafnium dioxide $HfO_2$ or a hafnium dioxide-based material as an active material, as for example an $HfZrO_2$ alloy (in the case of $HfZrO_2$, the steps of depositing and doping the active layer with $HfO_2$ can be considered equivalent to the deposition of the ternary $HfZrO_2$ alloy). The latter exhibits ferroelectric properties when doped with a particular dopant element in order to obtain a suitable dopant element concentration, and then crystallised in the orthorhombic phase. This material can also be used in resistive memories of the OxRAM type, based on the formation of a conductive filament when the material has oxygen vacancies.

FIGS. 1 to 10 illustrate the different steps 101 to 110 (flowchart of [FIG. 11]) of a first embodiment of the co-manufacturing method 100 according to the invention.

FIG. 1 illustrates the first step 101 of the method 100 according to an aspect of the invention.

FIG. 2 illustrates the second step 102 of the method 100 according to an aspect of the invention.

FIG. 3 illustrates the third step 103 of the method 100 according to an aspect of the invention.

FIG. 4 illustrates the fourth step 104 of the method 100 according to an aspect of the invention.

FIG. 5 illustrates the fifth step 105 of the method 100 according to an aspect of the invention.

FIG. 6 illustrates the sixth step 106 of the method 100 according to an aspect of the invention.

FIG. 7 illustrates the seventh step 107 of the method 100 according to an aspect of the invention.

FIG. 8 illustrates the eighth step 108 of the method 100 according to an aspect of the invention.

FIG. 9 illustrates the ninth step 109 of the method 100 according to an aspect of the invention.

FIG. 10 illustrates the tenth step 110 of the method 100 according to an aspect of the invention.

FIG. 11 shows the flowchart of the steps of the method according to an aspect of the invention illustrated in FIGS. 1 to 10.

The method 100 according to an aspect of the invention comprises a step 101 of conformally depositing a layer of first electrode 201 represented in FIG. 1. This deposition is carried out identically for the zone Z1 for forming the OxRAM resistive memory and the zone Z2 for forming the FeRAM ferroelectric memory. In other words, a single layer of first electrode 201 is deposited: the part of the layer of first electrode located in the first zone Z1 is to be the layer of first electrode 201 of the OxRAM resistive memory while the part of the layer of first electrode located in the second zone Z2 is to be the layer of first electrode 201 of the FeRAM ferroelectric memory. For the sake illustrative clarity, the layer 201 has been represented in two parts at Z1 and Z2, but it is understood that it is a single layer that is deposited to form both OxRAM and FeRAM memories, wherein insulation can then be achieved between said memories.

The layer of first electrode 201 is, for example, disposed on vias 200a and 200b, for example of tungsten, respectively for connecting the OxRAM and FeRAM memories to lower Cu metal levels. The first electrode 201 is referred to as the bottom electrode for both OxRAM and FeRAM. It will be appreciated that the layer of first electrode 201 may also be deposited on a substrate not represented.

The conductive material of the layer of first electrode 201 is for example titanium nitride TiN. TiN is a non-limiting example but other conductive materials such as TaN or W could also be used.

The deposition is for example a physical vapour deposition or PVD.

The thickness of the layer of first electrode 201 is for example between 10 nm and 200 nm.

The method 100 according to an aspect of the invention then includes a step 102 of depositing a layer of active material 202 represented in FIG. 2 consisting in carrying out conformal deposition of hafnium dioxide $HfO_2$. In the same way as for the step 101 of depositing the electrode layer 201, the step of depositing the layer of active material 202 consists in depositing a single layer of active material 202, the first zone Z1 of this single layer of active material 202 being intended to be the layer of active material 202 of the OxRAM resistive memory and the second zone Z2 of the layer of active material 202 being intended to be the layer of active material 202 of the FeRAM ferroelectric memory.

The deposition of the layer of active material 202 may be performed directly on the layer of first electrode 201 or on another layer previously deposited on the layer of first electrode 201.

The deposition is, for example, an atomic layer deposition or ALD between 200 and 300° C., which makes it possible to deposit layers of small thicknesses, in this case between 5 and 10 nm. This type of $HfO_2$ thickness is compatible with an active layer thickness usable both for OxRAM and FeRAM operations. The thickness of the layer of active material 202 is, for example, about 10 nm.

The method 100 also includes a step of doping 103 the layer of active material 202. By "doping a layer», it is meant the action of introducing atoms of another material called impurities into the material of the layer.

According to one embodiment represented in FIG. 3, the doping step 103 is carried out by ion implantation. Ion implantation doping consists in accelerating ionised impurities with an electric field, in order to provide them with the necessary energy to enter the material to be doped.

The dopant element used is in an embodiment silicon Si. However, other dopant elements such as aluminium Al, zirconium Zr, germanium Ge, gadolinium Gd, yttrium Y or nitrogen N could also be used.

According to this step 103, the entire layer 202 (i.e. both on the zone Z1 dedicated to making the OxRAM and on the zone Z2 dedicated to making the FeRAM) is doped identically.

The layer of active material 202 is, for example, exposed to a dopant dose between $10^{14}$ ions/cm$^2$ and $5.10^{14}$ ions/cm$^2$ at an energy between 2 keV and 4 keV. This doping range is compatible not only with the use of the active layer in an OxRAM resistive memory (subject to the creation of oxygen vacancies that will be further discussed below) but also with the use of the active layer in an FeRAM memory in order to obtain an orthorhombic phase with a suitable thermal budget. Contrary to patent application FR3090196, where the active layer of zone Z1 was over-doped with respect to the active layer of zone Z2, the active layer 202 is here doped identically.

According to an embodiment not represented, the doping step 103 may also be performed at the same time as the deposition of the active layer using a doping precursor. For example, the doping precursor is used during ALD deposition by alternating cycles of depositing hafnium dioxide HfO$_2$ and dopant elements and the number of cycles (i.e. referred to as ALD super-cycles). The doping precursor is for example silicon dioxide SiO$_2$.

According to another embodiment not represented, doping can also be carried out at the same time as the active layer by co-sputtering via a PVD (Phase Vapour Deposition) or via a PLD (Pulse Laser Deposition).

At the end of the doping step 103 represented in step 104 of FIG. 4, the layer of active material 202 has become a layer of HfO$_2$ active material 203, doped for example with Si.

The method 100 according to an aspect of the invention then includes a step 105 (FIG. 5) of depositing a first conductive layer 204 on the doped layer of HfO$_2$ active material 203. This deposition is carried out identically for the zone Z1 for forming the resistive OxRAM and the zone Z2 for forming the FeRAM ferroelectric memory.

The conductive material of the first conductive layer 204 is for example titanium nitride TiN. TiN is a non-limiting example but other conductive materials such as TaN or W could also be used.

The deposition is for example a physical vapour deposition or PVD.

The thickness of the first conductive layer 204 is in the order of 10 nm or more.

The method according to an aspect of the invention then includes a step 106 of making a mask 205 at the zone Z2 of the first conductive layer 204 for forming the ferroelectric memory, leaving the zone Z1 of the first conductive layer 204 for forming the OxRAM resistive memory free. The mask 205 is for example made of silicon nitride SiN, silicon oxide SiO$_2$ or resin. The mask 205 thus covers the part of the first conductive layer 204 located in the zone Z2. In a known way, the mask 205 can be made, for example, by:

conformally depositing a hard mask covering the first conductive layer both in the zone Z1 and in the zone Z2;

removing the portion of the hard mask at zone Z1 while stopping on the first conductive layer 204. The removal step is for example performed by lithography and etching.

Thus, at the end of step 106, only the zone Z1 of the first conductive layer 204 is directly accessible on the surface.

The method 100 includes a step 107 of removing the first conductive layer 204 at the zone Z1 of the first conductive layer for forming the OxRAM resistive memory, the zone Z2 of the first conductive layer 204 for forming the ferroelectric memory being protected by the mask 205. This removal operation is performed, for example, by plasma etching the first conductive layer 204, for example of TiN, plasma etching of TiN being highly selective towards the HfO$_2$ material of the active layer 203 so that etching stops on the HfO$_2$ active layer 203 in the zone Z1.

The method 100 then includes a step 108 of removing the mask 205 at the zone Z2 for forming the ferroelectric memory with a stopping on the first conductive layer 204. At the end of this step 108, the active layer 203 is bare in the zone Z1 and covered with the first conductive layer 204 in the zone Z2. The operation of removing the mask 205 is carried out, for example, by means of an oxygen plasma ("oxygen stripping") in the case where the mask 205 is made of resin.

The method 100 then includes a step 109 of conformally depositing a second conductive layer 206, said second conductive layer 206 being in contact with the first conductive layer 204 at the zone Z2 for forming the ferroelectric memory and in contact with the layer 203 of active material at the zone Z1 for forming the OxRAM resistive memory, and then conformally depositing a third conductive layer 207 carried out identically for the zone Z1 for forming the OxRAM resistive memory and the zone Z2 for forming the ferroelectric memory, said third conductive layer 207 being in contact with the second conductive layer 206.

The deposition of the layers 206 and 207 is for example a physical vapour deposition or PVD.

The conductive material of the third conductive layer 207 is for example titanium nitride TiN. TiN is a non-limiting example but other conductive materials, such as TaN, could also be used. It should be noted that the material chosen for the third conductive layer 207 may be different from the material chosen for the first conductive layer 204.

The thickness of the third conductive layer 207 is, for example, between 20 nm and 200 nm.

The conductive material of the second conductive layer 206 is chosen to be a material adapted to pump oxygen ("oxygen scavenging layer") present in the active layer 203 located in the zone Z1 on which the second conductive layer 206 is deposited. By pumping oxygen into the active layer 206, the second conductive layer 206 will create oxygen vacancies in the part of the active layer 203 dedicated to making the OxRAM, the oxygen vacancies being necessary for the proper operation of the OxRAM. Since the second conductive layer 206, on the other hand, is deposited on the first conductive layer 204 in the zone Z2 dedicated to FeRAM, it is therefore not in contact with the active layer 203 in the zone Z2 and will therefore not create any vacancies in the active layer 203 on the Z2 side. The material of the second conductive layer 206 is, for example, titanium Ti or Hafnium when the material of the third conductive layer 207 is TiN. It may also be Tantalum Ta Hafnium when the material of the third conductive layer 207 is TaN. It should be noted that Ti (respectively Ta) is a good bonding material for the TiN (respectively TaN) upper layer.

The thickness of the second conductive layer 206 is substantially identical to the thickness of the active layer 203, for example between 5 nm and 10 nm.

According to step 110 of the method 100 illustrated in FIG. 10, two upper vias 208a and 208b are made on the third conductive layer 207, respectively at the zone Z1 dedicated to OxRAM and at the zone Z2 dedicated to FeRAM.

FIG. 12 illustrates one alternative 111 of the method 100 according to an aspect of the invention. Thus, between step 108 and step 109, it is possible to remove a part (referenced here as 203a) of the thickness of the active layer at the zone Z1 dedicated to OxRAM and a part (referenced here as 204a) of the thickness of the first conductive layer at the zone Z2 dedicated to FeRAM. This step 111 takes place before depositing the second and third conductive layers. This removal can be carried out, for example, by argon plasma, which makes it possible to remove a few nanometres of the upper layers in a uniform and controlled manner, regardless of their chemical nature ("preclean" type plasma). It allows both removal of native oxide on the first conductive layer (e.g. TiN) and decrease in the thickness of the active material on the OxRAM side (thus allowing, in particular, a reduction in the forming and writing voltages of the OxRAM).

The material of the active layer 203 has to be crystallised in an orthorhombic phase in order to allow the latter to operate as a ferroelectric memory in the zone Z2. To do this, several solutions are contemplatable. The first may consist in annealing at a temperature adapted to the backend process, between 300° C. and 500° C., for example in the order of 450° C.: this annealing may, for example, take place in step 105 (before or, in an embodiment, after the deposition of the first conductive layer 204). However, this annealing can be dispensed with by using the cumulative thermal budget in the order of 300° C. of the manufacturing method of FIG. 11, to which the end of the manufacturing method not represented here is added and including, especially, the encapsulation of the OxRAM and FeRAM memory points by spacers or by a continuous layer of insulator after backend integration of the memory points above the CMOS transistors. In general, heat treatment of the active layer 203 is therefore performed in order to crystallise it in its orthorhombic phase, this heat treatment being either an annealing (for example carried out after the deposition of the first conductive layer 204) or a heat treatment ensuring orthorhombic crystallisation without necessarily a specific annealing, via the steps leading to the encapsulation of the OxRAM and FeRAM memories. An example of the encapsulation of the CMOS transistor levels and the OxRAM and FeRAM memory levels integrated in backend and encapsulated in an oxide layer is illustrated in [FIG. 26].

At the end of the method 100 according to an embodiment of the invention, a device co-integrating a ferroelectric memory arranged in the dedicated zone Z2 and an OxRAM memory arranged in the dedicated zone Z1 is thus obtained. The ferroelectric memory includes a first electrode (known as the bottom electrode), a second electrode (known as the top electrode) and a layer of hafnium dioxide $HfO_2$ active material disposed between the first electrode and the second electrode. Similarly, the OxRAM resistive memory includes a first electrode (known as the bottom electrode), a second electrode (known as the top electrode) and a layer of hafnium dioxide $HfO_2$ active material disposed between the first electrode and the second electrode. The bottom electrodes of the FeRAM and OxRAM memories are formed by the same layer of first electrode 201. The layers of hafnium dioxide $HfO_2$ active materials of the FeRAM and OxRAM memories are formed by the same doped layer of $HfO_2$ active material 203 crystallised in its orthorhombic phase.

The top electrode of the FeRAM is formed by a tri-layer including in its dedicated zone Z2, the first conductive layer 204, the second conductive layer 206 and the third conductive layer 207.

The top electrode of the OxRAM is formed by a bilayer including in its dedicated zone Z1, the second conductive layer 206 and the third conductive layer 207.

When the device according to an embodiment of the invention is in its original state, just after its manufacture, the switching zone (i.e. the active layer) of the OxRAM memory has to be formed for the first time by applying a forming voltage Vforming greater than its writing voltage Vset between both electrodes of the OxRAM memory. Thereafter, the OxRAM enters a normal operating mode in which the write voltage Vset and the erase voltage Vreset (opposite in sign to the write voltage) are used to switch the resistance state of the OxRAM resistive memory.

By applying a Pup programming voltage across the electrodes of the FeRAM memory greater than the voltage creating an electric field of a value greater than the positive coercive field +Ec, the ferroelectric memory will be placed in a high remanent polarisation state +Pr. Similarly, by applying a Pdown voltage greater than the electric field-creating voltage greater than the negative coercive field −Ec across the FeRAM memory, the FeRAM will be placed in a low remanent polarisation state −Pr.

FIGS. 13 to 23 illustrate the different steps 101' to 111' (flowchart of FIG. 23) of a second embodiment of the co-manufacturing method 100' according to the invention.

FIG. 13 illustrates the first step 101' of the method 100' according to an aspect of the invention.

FIG. 14 illustrates the second step 102' of the method 100' according to an aspect of the invention.

FIG. 15 illustrates the third step 103' of the method 100' according to an aspect of the invention.

FIG. 16 illustrates the fourth step 104' of the method 100' according to an aspect of the invention.

FIG. 17 illustrates the fifth step 105' of the method 100' according to an aspect of the invention.

FIG. 18 illustrates the sixth step 106' of the method 100' according to an aspect of the invention.

FIG. 19 illustrates the seventh step 107' of the method 100' according to an aspect of the invention.

FIG. 20 illustrates the eighth step 108' of the method 100' according to an aspect of the invention.

FIG. 21 illustrates the ninth step 109' of the method 100' according to an aspect of the invention.

FIG. 22 illustrates the tenth step 110' of the method 100' according to an aspect of the invention.

FIG. 23 illustrates the eleventh step 111' of the method 100' according to an aspect of the invention.

FIG. 24 shows the flowchart of the steps of the method 100' according to an aspect of the invention illustrated in FIGS. 13 to 23.

The method 100' according to the second embodiment of the invention is very similar to the method 100 previously illustrated with the difference that it aims at obtaining a three-dimensional architecture for the cointegrated OxRAM and ferroelectric memories. The interest of such a configuration is to be able to increase, in particular in the case of very advanced nodes, the surface area of the capacitance of the FeRAM.

The method 100' according to an aspect of the invention comprises a step 101' of conformally depositing a layer of first electrode 201' represented in FIG. 13. This deposition is carried out identically for the zone Z1 for forming the OxRAM resistive memory and the zone Z2 for forming the FeRAM ferroelectric memory. In other words, a single layer of first electrode 201' is deposited: the part of the layer of first electrode 201' located in the first zone Z1 is to be the layer of first electrode 201' of the OxRAM resistive memory while the part of the layer of first electrode located in the second zone Z2 is to be the layer of first electrode 201' of the FeRAM ferroelectric memory. For the sake illustrative clarity, the 201' layer has been represented in two parts on the zones Z1 and Z2, but it is understood that it is indeed a single layer that is deposited to form both memories OxRAM and FeRAM, and an insulation can then be achieved between said memories.

In contrast to the first embodiment, the layer of first electrode 201' is deposited, for example, in a pit 300 in the zone Z1 and a pit 301 in the zone Z2, both pits 300 and 301 being disposed, for example, above vias 200a' and 200b', for example made of tungsten, respectively to connect the OxRAM and FeRAM memories to lower metal levels of Cu. The first electrode 201' is referred to as the bottom electrode for both OxRAM and FeRAM. The pits 300 and 301 could be replaced by conductive vias in which the layer of first electrode 201' would be deposited. The pits 300 and 301 are for example made of a TEOS-type oxide. After deposition of the TEOS, or of an oxide/SiN bilayer, a lithography and then an etching is, for example, carried out in order to etch by forming the pits up to the vias 200a' and 200b', and then the resin is removed by means of an oxygen plasma.

The conductive material of the layer of first electrode 201' is for example titanium nitride TiN.

The deposition of the layer of first electrode 201' is, for example, an atomic layer deposition or ALD as conformal as possible so that the layer 201' snugly fits the respective internal wall of the pits 300 and 301.

The thickness of the layer of first electrode 201' is for example between 10 nm and 200 nm.

The method 100' according to an aspect of the invention then includes a step 102' of depositing a layer of active material 202' represented in FIG. 14, consisting in carrying out conformal deposition of hafnium dioxide $HfO_2$. In the same way as for the step 101' of depositing the electrode layer 201', the step of depositing the layer of active material 202' consists in depositing a single layer of active material 202', the first zone Z1 of this single layer of active material 202' being intended to be the layer of active material 202' of the OxRAM resistive memory and the second zone Z2 of the layer of active material 202' being intended to be the layer of active material 202' of the FeRAM ferroelectric memory.

The deposition is, for example, a very conformal deposition of atomic thin films or ALD (Atomic Layer Deposition) between 200 and 300° C., which makes it possible to deposit layers of small thicknesses, here for example between 5 and 10 nm. This type of $HfO_2$ thickness is compatible with an active layer thickness that can be used for both OxRAM and FeRAM operation. The thickness of the layer of active material 202' is for example about 10 nm. It is understood that the use of pits gives a three-dimensional shape to the memories for increasing the surface area of active material, and thus the useful capacitive surface area of the ferroelectric memory.

The method 100' also includes a step 103' of doping the layer of active material 202'.

According to one embodiment represented in FIG. 15, the doping step 103' is performed by plasma immersion ion implantation, so as to have a doping as conformal as possible.

The dopant element used is in an embodiment silicon Si. However, other dopant elements such as aluminium Al, zirconium Zr, germanium Ge, gadolinium Gd, yttrium Y or nitrogen N could also be used.

According to this step 103', the entire layer 202' (i.e. both on the zone Z1 dedicated to making the OxRAM and on the zone Z2 dedicated to making the FeRAM) is doped identically. The layer of active material 202' is for example exposed to a dopant dose between $10^{14}$ ions/cm$^2$ and $5.10^{14}$ ions/cm$^2$ at an energy between 2 keV and 4 keV, in the case of Si doping.

As for the first embodiment, the doping step 103' may also be performed at the same time as the deposition of the active layer using a doping precursor. For example, the doping precursor is used during the ALD deposition by alternating the cycles of depositing hafnium dioxide $HfO_2$ and dopant elements and the number of cycles (i.e. referred to as ALD super-cycles). The doping precursor is for example silicon dioxide $SiO_2$. Doping can also be carried out at the same time as the active layer by co-sputtering via PVD (Phase Vapour Deposition) or PLD (Pulse Laser Deposition).

At the end of the doping step 103' represented in step 104' of FIG. 16, the layer of active material 202' has become a layer of $HfO_2$ active material 203', doped for example with Si.

The method 100' according to an aspect of the invention then includes a step 105' (FIG. 17) of conformally depositing a first conductive layer 204' on the doped layer of $HfO_2$ active material 203'. This deposition is carried out identically for the zone Z1 for forming the OxRAM resistive memory and the zone Z2 for forming the FeRAM ferroelectric memory.

The conductive material of the first conductive layer 204 is for example titanium nitride TiN. TiN is a non-limiting example but other conductive materials such as TaN or W could also be used.

The deposition is, for example, Physical Vapour Deposition (PVD) or Atomic Layer Deposition (ALD).

The thickness of the first conductive layer 204' is in the order of 10 nm or more.

The method 100' according to an aspect of the invention then includes a step 106' of making a mask 205' at the zone Z2 of the first conductive layer 204' for forming the ferroelectric memory, leaving the zone Z1 of the first conductive layer 204' for forming the OxRAM resistive memory free. The mask 205' is for example made of silicon nitride SiN, silicon oxide $SiO_2$ or resin. The mask 205' thus covers the part of the first conductive layer 204' located in the zone Z2. In a known way, the mask 205' can be made, for example, by:

depositing a hard mask covering the first conductive layer both in the zone Z1 and in the zone Z2;

removing the part of the hard mask at the zone Z1 with stopping on the first conductive layer 204'. The removal step is for example performed by lithography and etching.

For the sake of illustration, the mask 205' is shown suspended above the pit 301 but it is not necessarily intended to show a hard mask suspended above the pit. If the mask is of resin (spin-off deposited), the resin will fill the pit, which does not alter the method described.

Thus, at the end of step 106', only the zone Z1 of the first conductive layer 204' is directly accessible on the surface.

The method 100' includes a step 107' of removing the first conductive layer 204' at the zone Z1 of the first conductive layer for forming the OxRAM resistive memory, the zone Z2 of the first conductive layer 204' for forming the ferroelectric memory being protected by the mask 205'. This removal operation is carried out, for example, by plasma etching the first conductive layer 204', for example of TiN, the plasma etching of TiN being highly selective towards the $HfO_2$ material of the active layer 203' so that the etching stops on the active layer 203' of $HfO_2$ in the zone Z1.

The method 100' then includes a step 108' of removing the mask 205' at the zone Z2 for forming the ferroelectric memory with stopping on the first conductive layer 204'. At the end of this step 108', the active layer 203' is bare in the zone Z1 and covered with the first conductive layer 204' in the zone Z2. The operation of removing the mask 205' is carried out, for example, using an oxygen plasma ("oxygen stripping").

The method 100' then includes a step 109' of conformally depositing a second conductive layer 206', said second conductive layer 206' being in contact with the first conductive layer 204' at the zone Z2 for forming the ferroelectric memory and in contact with the layer 203' of active material at the zone Z1 for forming the OxRAM resistive memory. Step 109' also includes non-conformally depositing a third conductive layer 207' carried out identically for the zone Z1 for forming the OxRAM resistive memory and the zone Z2 for forming the ferroelectric memory, said third conductive layer 207' being in contact with the second conductive layer 206. The deposition of the third conductive layer 207' is non-conformal so as to fill the respective not yet filled, parts of the pits 300 and 301.

The deposition of the layers 206' and 207' is for example a physical vapour deposition or PVD. The deposition will be either chosen conformal or non-conformal, depending on the diameter of the pit. If the diameter of the pit is typically less than 100 nm, a conformal deposit will be favoured.

The conductive material of the third conductive layer 207' is for example titanium nitride TiN. TiN is a non-limiting example but other conductive materials such as TaN could also be used. It will be noted that the material chosen for the third conductive layer 207' may be different from the material chosen for the first conductive layer 204'.

The thickness of the third conductive layer 207' should be such that the pits 300 and 301' are completely filled.

The conductive material of the second conductive layer 206' is chosen to be a material adapted to pump oxygen ("oxygen scavenging layer") present in the active layer 203' located in the zone Z1 on which the second conductive layer 206' is deposited. By pumping oxygen into the active layer 206', the second conductive layer 206' will create oxygen vacancies in the part of the active layer 203' dedicated to making the OxRAM, the oxygen vacancies being necessary for the proper operation of the OxRAM. Since the second conductive layer 206', on the other hand, is deposited on the first conductive layer 204' in the zone Z2 dedicated to FeRAM, it is therefore not in contact with the active layer 203' in the zone Z2 and will therefore not create any vacancies in the active layer 203' on the Z2 side. The material of the second conductive layer 206' is, for example, Ti or Hafnium when the material of the third conductive layer 207' is TiN. It may also be Tantalum Ta Hafnium when the material of the third conductive layer 207' is TaN. It will be noted that Ti (respectively Ta) is a good bonding material for the TiN (respectively TaN) upper layer.

The thickness of the second conductive layer 206' is substantially identical to the thickness of the active layer 203', for example between 5 nm and 10 nm.

According to step 110' of the method 100' illustrated in FIG. 22, a removal by controlled chemical mechanical polishing (CMP) of all the layers 207', 206', 203', 201' is carried out with stopping on the upper surface of the pits 300 and 301.

According to step 111 of the method 100 illustrated in FIG. 10, two upper vias 208a' and 208b' are made on the third conductive layer 207', respectively at the level of the zone Z1 dedicated to the OxRAM and at the level of the zone Z2 dedicated to the FeRAM.

At the end of the method 100' according to an embodiment of the invention, a device co-integrating a ferroelectric memory arranged in the dedicated zone Z2 and an OxRAM memory arranged in the dedicated zone Z1 is thus obtained.

The ferroelectric memory is arranged in three dimensions within a pit 301 in which the internal wall is successively covered with a first electrode (called bottom electrode), a layer of hafnium dioxide $HfO_2$ active material and a second electrode (called top electrode). Similarly, the OxRAM memory is arranged in three dimension within a pit 300 in which the internal wall is successively covered with a first electrode (referred to as the bottom electrode), a layer of hafnium dioxide $HfO_2$ active material and a second electrode (referred to as the top electrode). The bottom electrodes of FeRAM and OxRAM memories are formed by the same layer of first electrode 201'. The layers of hafnium dioxide $HfO_2$ active material of the FeRAM and OxRAM memories are formed by the same layer of doped $HfO_2$ active material 203' crystallised in its orthorhombic phase.

The top electrode of the FeRAM is formed by a tri-layer successively including the first conductive layer 204', the second conductive layer 206' and the third conductive layer 207' in the pit 301.

The top electrode of the OxRAM is formed by a bilayer successively including the second conductive layer 206' and the third conductive layer 207' in the pit 300.

According to an alternative of the method 100' according to the second embodiment of the invention, between step 108' and step 109', it is possible to remove part of the thickness of the active layer at the zone Z1 dedicated to the OxRAM and part of the thickness of the first conductive layer at the zone Z2 dedicated to the FeRAM. This step takes place before the deposition of the second and third conductive layers.

As previously in the case of the method 100 according to a first embodiment, the material of the active layer 203' should be crystallised in an orthorhombic phase for operating it as a ferroelectric memory in the zone Z2.

The operation in forming, writing and reading the memories is identical to that previously described.

According to a third embodiment of the method according to the invention, it is possible to make a two-dimensional OxRAM resistive memory as described with reference to the method 100 according to the first embodiment and a three-dimensional ferroelectric memory (i.e. in a pit in order to increase the capacitive surface area) as described with reference to the method 100' according to the second embodiment of the invention.

The invention claimed is:

1. A method for co-manufacturing a ferroelectric memory comprising a first electrode, a second electrode and a layer of hafnium dioxide-based active material disposed between the first electrode and the second electrode and an OxRAM resistive memory comprising a first electrode, a second electrode and a layer of hafnium dioxide-based active material disposed between the first electrode and the second electrode, the co-manufacturing method comprising:
   a step of depositing a layer of first electrode carried out identically for a so zone for forming the OxRAM resistive memory and a zone for forming the ferroelectric memory;
   a step of depositing a layer of hafnium dioxide-based active material carried out identically for the zone for forming the OxRAM resistive memory and the zone for forming the ferroelectric memory;
   a step of depositing a first conductive layer carried out identically for the zone for forming the OxRAM resistive memory and the zone for forming the ferroelectric memory;
   a step of making a mask at the zone of the first conductive layer for forming the ferroelectric memory, leaving the zone of the first conductive layer for forming the OxRAM resistive memory free;
a step of removing the first conductive layer at the zone of the first conductive layer for forming the OxRAM resistive memory, the zone of the first conductive layer for forming the ferroelectric memory being protected by the mask;
a step of removing the mask at the zone of the first conductive layer for forming the ferroelectric memory;
a step of depositing a second conductive layer, said second conductive layer being in contact with the first conductive layer at the zone of the first conductive layer for forming the ferroelectric memory and in contact with the layer of active material at the zone of the first conductive layer for forming the OxRAM, the material of the second conductive layer being selected to create oxygen vacancies in the layer of active material of the OxRAM when the second conductive layer is in contact with the layer of active material of the OxRAM;
a step of depositing a third conductive layer carried out identically for the zone for forming the OxRAM and the zone for forming the ferroelectric memory, said third conductive layer being in contact with the second conductive layer.

2. The method according to claim 1, wherein the step of making the mask at the zone of the first conductive layer for forming the ferroelectric memory leaving the zone of the first conductive layer for forming the OxRAM resistive memory free includes the following steps:
a step of depositing a mask on the first conductive layer at the zone of the first conductive layer for forming the ferroelectric memory and the zone of the first conductive layer for forming the OxRAM resistive memory;
a step of removing the mask at the zone of the first conductive layer for forming the OxRAM resistive memory while leaving the mask at the zone of the first conductive layer for forming the ferroelectric memory.

3. The method according to claim 1, further comprising, at an end of the step of depositing the layer of hafnium dioxide-based active material, a step of doping the layer of active material carried out identically for the zone for forming the OxRAM resistive memory and the zone for forming the ferroelectric memory.

4. The method according to claim 3, wherein the doping step is carried out by ion implantation or using a doping precursor or by co-sputtering.

5. The method according to claim 3, wherein the dopant element used for the doping step is selected from one of the following elements: Si, Al, Zr, Gd, Ge, Y or N.

6. The method according to claim 3, wherein the dopant element is Si and, during the doping step, the layer of active material is exposed to a dopant dose of between $10^{14}$ ions/cm$^2$ and $5.10^{14}$ ions/cm$^2$.

7. A device including an OxRAM resistive memory arranged in a first dedicated zone and a ferroelectric memory arranged in a second dedicated zone,
the ferroelectric memory including a first electrode, a second electrode and a layer of hafnium dioxide-based active material disposed between the first electrode and the second electrode,
the OxRAM resistive memory including a first electrode, a second electrode and a layer of hafnium dioxide-based active material disposed between the first electrode and the second electrode,
bottom electrodes of the OxRAM ferroelectric and resistive memories being formed by a same layer of first electrode present on the first and second dedicated zones,
the respective layer of hafnium dioxide-based active materials of the OxRAM ferroelectric and resistive memories being formed by a same layer of hafnium dioxide-based active material present on the first and second dedicated zones,
the second electrode of the ferroelectric memory being formed by a tri-layer including, in the second dedicated zone, a first conductive layer in contact with the layer of active material, a second conductive layer on the first conductive layer and a third conductive layer on the second conductive layer,
the second electrode of the resistive OxRAM being formed by a bi-layer including the second conductive layer in contact with the layer of active material and the third conductive layer on the first conductive layer, in the first dedicated zone,
the material of the second conductive layer being selected to create oxygen vacancies in the layer of active material of the OxRAM resistive memory when the second conductive layer is in contact with the layer of active material of the OxRAM resistive memory.

8. The device according to claim 7, wherein a thickness of the layer of active material and/or a thickness of the second conductive layer is between 3 nm and 15 nm.

9. The device according to claim 7, wherein a thickness of the third conductive layer is between 20 nm and 200 nm.

10. The device according to claim 7, wherein the ferroelectric memory includes a pit having an inner wall on which the layer of first electrode, the layer of hafnium dioxide-based active material, the tri-layer including the first conductive layer, the second conductive layer and the third conductive layer on the second conductive layer are successively arranged.

11. A method for training and inferring an artificial intelligence system including a device according to claim 7, wherein the ferroelectric memory is used in training phases and the OxRAM resistive memory is used in inference phases.

* * * * *